(12) United States Patent
Isobe et al.

(10) Patent No.: US 6,549,154 B2
(45) Date of Patent: Apr. 15, 2003

(54) DIGITAL-TO-ANALOG CONVERTER AND SYNCHRONOUS CIRCUIT USING THE CONVERTER

(75) Inventors: Katsuaki Isobe, Yokohama (JP); Satoshi Eto, Kokubunji (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/007,694

(22) Filed: Dec. 10, 2001

(65) Prior Publication Data
US 2002/0125928 A1 Sep. 12, 2002

(30) Foreign Application Priority Data
Jan. 30, 2001 (JP) .................................... 2001-022160

(51) Int. Cl.[7] .............................................. H03M 1/80
(52) U.S. Cl. ....................................... 341/144; 341/153
(58) Field of Search ........................ 341/144, 94, 120, 341/118, 119, 148

(56) References Cited

U.S. PATENT DOCUMENTS 6,281,824 B1 * 8/2001 Masuda ...................... 341/144

* cited by examiner

Primary Examiner—Brian Young
(74) Attorney, Agent, or Firm—Banner & Witcoff, Ltd.

(57) ABSTRACT

A digital-to-analog converter circuit includes a converter configured to convert digital signals of bit n (n=0, 1, 2, ..., N) to voltage values, a plurality of amplifiers configured to output currents having different values in accordance with the voltage values, and an adder configured to assigning weights to the currents and adding the currents together in response to the digital signal of bit n.

20 Claims, 7 Drawing Sheets

DIGITAL-TO-ANALOG CONVERTER AND SYNCHRONOUS CIRCUIT USING THE CONVERTER

CROSS-REFERENCE TO RELATED APPLICATIONS

This application is based upon and claims the benefit of priority from the prior Japanese Patent Application No. 2001-022160, filed Jan. 30, 2001, the entire contents of which are incorporated herein by reference.

BACKGROUND OF THE INVENTION

1. Field of the Invention

The present invention relates to a digital-to-analog converter and a synchronous circuit using the converter. More specifically, the present invention relates to an analog DLL (delayed locked loop) provided in a DRAM (dynamic random access memory).

2. Description of the Related Art

A prior art DRAM includes an analog DLL using a digital-to-analog converter. The analog DLL is provided in order to make the rising timing of an input clock signal and that of an output clock signal coincident with each other.

FIG. 10 shows an example of a configuration of the above-described analog DLL. In FIG. 10, a DAC (digital-to-analog converter) 1 converts a digital signal (bit n(nx)) to a current amount (analog signal nout). The digital signal (bit n(nx)) is supplied from a bit controller 5 serving as a generation circuit. The DAC 1 sends the analog signal nout to a delay line 2. In accordance with the current amount, an operation of a delay unit (not shown) that is a unit delay element for control of current is controlled. Thus, the delay line 2 varies an amount of delay between a reference signal rclk and an output signal iclk.

A replica circuit 3 generates a delay signal dclk from the output signal iclk of the delay line 2 and supplies the delay signal dclk to a phase detector 4. The phase detector 4 compares the phases of the delay signal dclk and reference signal rclk to obtain a phase difference signal px and supplies the signal px to the bit controller 5. The bit controller 5 converts the phase difference signal px to the digital signal (bit n(nx)).

In the analog DLL so configured, a parallel-variable-resistance type DAC is commonly used. This type of DAC comprises a digital voltage converter 101, a differential amplifier 102, and a current generation circuit 103, as illustrated in FIG. 11.

The digital voltage converter 101 includes a constant-current source 101a and a parallel variable resistor 101b. The parallel variable resistor 101b has a resistor R0 and a plurality of resistors r0/n arranged in parallel with the resistor R0 (In FIG. 11, a plurality of resistors r0 are shown as a composite one r0/n for the sake of convenience). The digital voltage converter 101 controls a resistance value of the parallel variable resistor 101b in response to the digital signal (bit n(nx)). The number n of resistors r0 connected to the resistor R0 is changed. Thus, the digital voltage converter 101 freely varies a generated potential Vx in response to the digital signal (bit n(nx)). The potential Vx is expressed by the following equation:

$$Vx=(I0)*(R0*r0/n)/(R0+r0/n)$$

The differential amplifier 102 includes a current-mirror type operational amplifier 102a, a PMOS transistor (channel width Wa) 102b, and a resistor R. The digital voltage converter 101 applies the potential Vx to an inverting input (−) terminal of the operational amplifier 102a. The gate of the PMOS transistor 102b is connected to the output terminal of the operational amplifier 102a. The drain of the PMOS transistor 102b is connected to a noninverting input (+) terminal of the operational amplifier 102a. The resistor R is connected to the drain of the PMOS transistor 102b. In other words, the differential amplifier 102 controls current Ix flowing through the resistor R such that the potential Vx at the inverting input terminal of the operational amplifier 102a and the potential Vy at the noninverting input terminal thereof become equal to each other.

The current generation circuit 103 includes a PMOS transistor (channel width Wb) 103a and an NMOS transistor 103b. The PMOS transistor 103a is mirror-connected to the PMOS transistor 102b. The gate and drain of the NMOS transistor 103b are connected to the drain of the PMOS transistor 103a. In other words, the current generation circuit 103 mirrors the current Ix based on the ratio of channel width Wa of the PMOS transistor 102b to channel width Wb of the PMOS transistor 103a. Thus, the circuit 103 generates a current (analog signal nout) I in response to the output (current Ix) of the differential amplifier 102. The current I is given by the following equation:

$$I=(Vx/R)*(Wb/Wa)$$

In the analog DLL described above, the DAC 1 varies the amount of current I supplied to the delay line 2 in response to the digital signal (bit n(nx)). Then, the DAC 1 changes the amount of delay on the delay line 2 in accordance with the amount of current I. The reference signal rclk and the output signal iclk are therefore synchronized with each other.

In the parallel variable resistance type DAC, however, the amount of current I cannot completely be changed freely in response to the digital signal (bit n(nx)) since the above DAC has the following two constraints.

The first constraint is concerned with an input voltage (potential Vx at the inverting input terminal) of the current-mirror type operational amplifier 102a. The potential Vx should be one capable of stably operating a current mirror. When a power supply level is set at 1.8V, the potential necessary for stably operating the current mirror ranges from about 0.5V to 1.5V. The amount of variation ΔI in current I supplied to the delay line 2 thus depends upon the amount of change of potential Vx. The variation amount ΔI depends upon the operating range of the current mirror.

The second constraint is concerned with a high frequency. For synchronization with a high-frequency clock signal, a certain amount of current has to flow because the delay line 2 varies the rising/falling speed of pulse in accordance with the amount of current I to be supplied. The delay amount is changed accordingly. If the current flowing through the high-frequency clock signal is too small, pulses will disappear. The disappearance of pulses makes synchronization with the clock signal impossible.

Under the above constraints, the variation amount ΔI of current I is fixed almost uniquely. If the variation amount ΔI in the DAC 1 is fixed, the amount of delay caused by the delay line 2 is done. In order to vary the amount of delay, the number of delay elements has only to be changed. Therefore, a number of delay elements are required in order to broaden the frequency range of a clock signal for synchronization.

BRIEF SUMMARY OF THE INVENTION

A digital-to-analog converter circuit according to a first aspect of the present invention comprises a converter configured to convert digital signals of bit n (n=0, 1, 2, ..., N) to voltage values, a plurality of amplifiers configured to output currents having different values in accordance with the voltage values, and an adder configured to assigning weights to the currents and adding the currents together in response to the digital signal of bit n.

A synchronous circuit according to a second aspect of the present invention comprises a digital-to-analog converter circuit including a converter configured to convert digital signals of bit n (n=0, 1, 2, ..., N) to voltage values, a plurality of amplifiers configured to output currents having different values in accordance with the voltage values obtained by the converter, and an adder configured to assign weights to the currents and add the currents together in response to the digital signals of bit n, a delay line including a unit delay element that receives an output from the digital-to-analog converter circuit and varies in delay amount according to the output, a phase detector configured to compare an output of the delay line and a phase of a reference signal with each other, and a generator configured to generate the digital signal of bit n in response to an output of the phase detector.

A synchronous circuit according to a third aspect of the present invention comprises a digital-to-analog converter circuit including a converter configured to convert digital signals of bit n (n=0, 1, 2, ..., N) to voltage values, a plurality of amplifiers configured to output currents having different values in accordance with the voltage values obtained by the converter, and an adder configured to assign weights to the currents and add the currents together in response to the digital signals of bit n, the adder having a common node supplied with the added currents and connected to a gate and a drain of a transistor, a delay line including a unit delay element that receives an output from the digital-to-analog converter circuit and varies in delay amount according to the output, a phase detector configured to compare an output of the delay line and a phase of a reference signal with each other, and a generator configured to generate the digital signal of bit n in response to an output of the phase detector.

DETAILED DESCRIPTION OF THE INVENTION

Embodiments of the present invention will now be described with reference to the accompanying drawings.

First Embodiment

Figure 1:
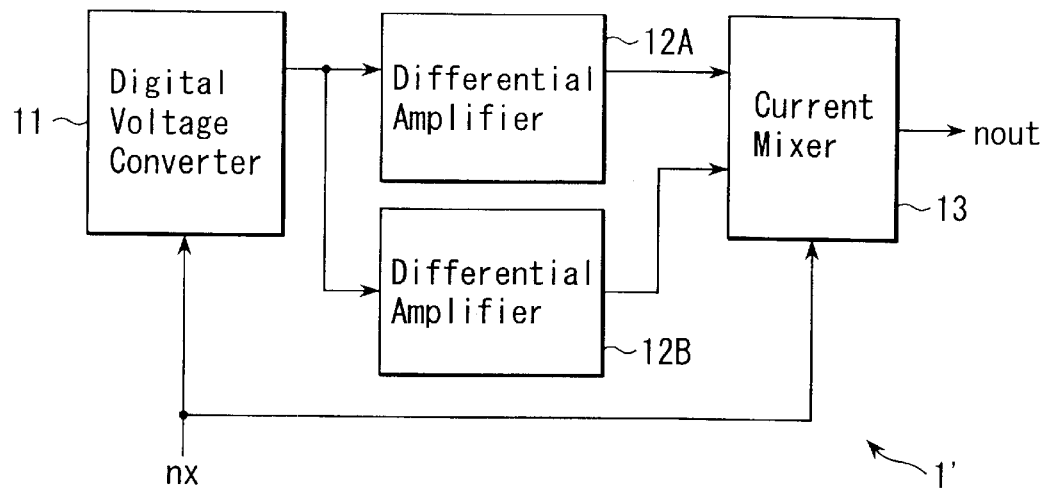
FIG. 1 is a block diagram showing an example of a configuration of a DAC according to a first embodiment of the present invention, which is used in an analog DLL.

FIG. 1 shows a configuration of a DAC according to a first embodiment of the present invention, which is used in an analog DLL serving as a synchronous circuit. The DAC 1' comprises a digital voltage converter 11, differential amplifiers 12A and 12B, and a current mixer 13 as an adder.

Figure 2:
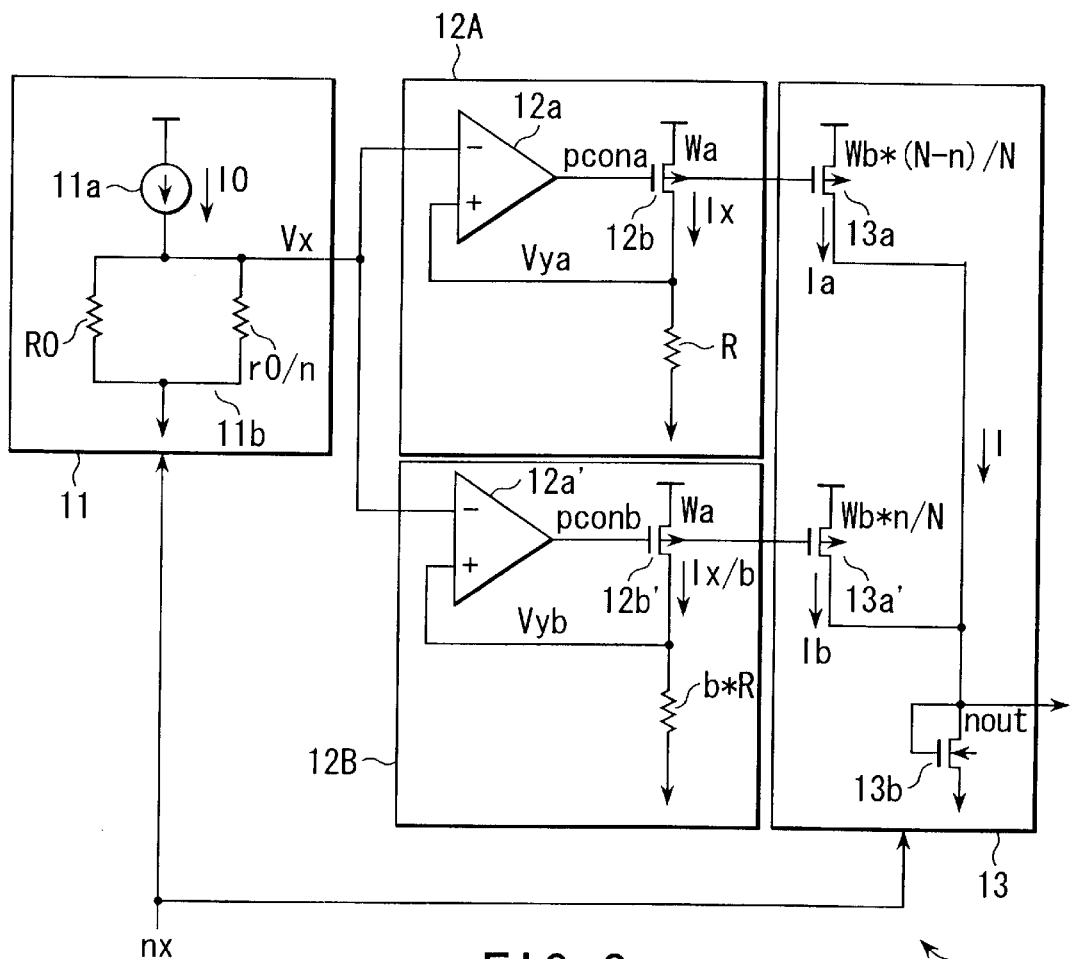
FIG. 2 is a circuit diagram of an example of the DAC shown in FIG. 1.

The digital voltage converter 11 includes a constant-current source 11a and a parallel variable resistor 11b, as illustrated in FIG. 2. The parallel variable resistor 11b has a resistor R0 as a first resistor and a plurality of resistors r0/n as second resistors arranged in parallel with the resistor R0 (in FIG. 1, a plurality of resistors r0 are shown as a composite one r0/n for the sake of convenience). The digital voltage converter 11 controls a resistance value of the parallel variable resistor 11b in response to a digital signal (bit n(nx): nx=0, 1, 2, ..., N). The number n of resistors r0 connected to the resistor R0 is changed. Thus, the digital voltage converter 11 freely varies a generated potential Vx in response to the digital signal (bit n(nx)). The potential Vx is expressed by the following equation:

$$Vx=(I0)*(R0*r0/n)/(R0+r0/n)$$

The differential amplifier 12A includes a current-mirror type operational amplifier 12a, a PMOS transistor (channel width Wa) 12b as a first transistor, and a resistor (third resistor) R, as shown in FIG. 2. The potential Vx generated from the digital voltage converter 11 is applied to an inverting input (−) terminal of the operational amplifier 12a. The gate of the PMOS transistor 12b is connected to the output terminal of the operational amplifier 12a. The drain of the PMOS transistor 12b is connected to a noninverting input (+) terminal of the operational amplifier 12a. The resistor R is connected to the drain of the PMOS transistor 12b. In other words, the differential amplifier 12A controls current (first current) Ix flowing through the resistor R such that the potential Vx at the inverting input terminal of the operational amplifier 12a and the potential Vya at the noninverting input terminal thereof become equal to each other.

The differential amplifier 12B includes a current-mirror type operational amplifier 12a', a PMOS transistor (channel width Wa) 12b' as a first transistor, and a resistor (third resistor) b*R, as shown in FIG. 2. The potential Vx generated from the digital voltage converter 11 is applied to an inverting input (−) terminal of the operational amplifier 12a'. The gate of the PMOS transistor 12b' is connected to the output terminal of the operational amplifier 12a'. The drain of the PMOS transistor 12b' is connected to a noninverting input (+) terminal of the operational amplifier 12a'. The resistor b*R is connected to the drain of the PMOS transistor 12b'. The resistance value of the resistor b*R is b (b>1) times as large as that of the resistor R. In other words, the differential amplifier 12B controls current (second current) Ix/b flowing through the resistor b*R such that the potential Vx at the inverting input terminal of the operational amplifier 12a' and the potential Vya at the noninverting input terminal thereof become equal to each other.

Referring to FIG. 2, the current mixer 13 includes PMOS transistors 13a and 13a' as second transistors and an NMOS transistor 13b as a third transistor. The channel width of the PMOS transistor 13a is Wb*(N−n)/N. The PMOS transistor 13a is mirror-connected to the PMOS transistor 12b of the differential amplifier 12A. The channel width of the PMOS transistor 13a' is Wb*n/N. The PMOS transistor 13a' is mirror-connected to the PMOS transistor 12b' of the differential amplifier 12B. The gate and drain of the NMOS transistor 13b are connected to each of the drains of the PMOS transistors 13a and 13a'. The current mixer 13 assigns weights to the above currents Ix and Ix/b and adds them together using the digital signal (bit n(nx)). The current Ix is mirrored in accordance with the ratio of the channel width of the PMOS transistor 12b to that of the PMOS transistor 13a to generate current Ia. The current Ix/b is mirrored in accordance with the ratio of the channel width of the PMOS transistor 12b' to that of the PMOS transistor 13a to generate current Ib. The currents Ia and Ib are mixed by the NMOS transistor 13b. Thus, the current mixer 13 produces an analog signal nout corresponding to the amount of current I (=Ia+Ib).

Figure 3:
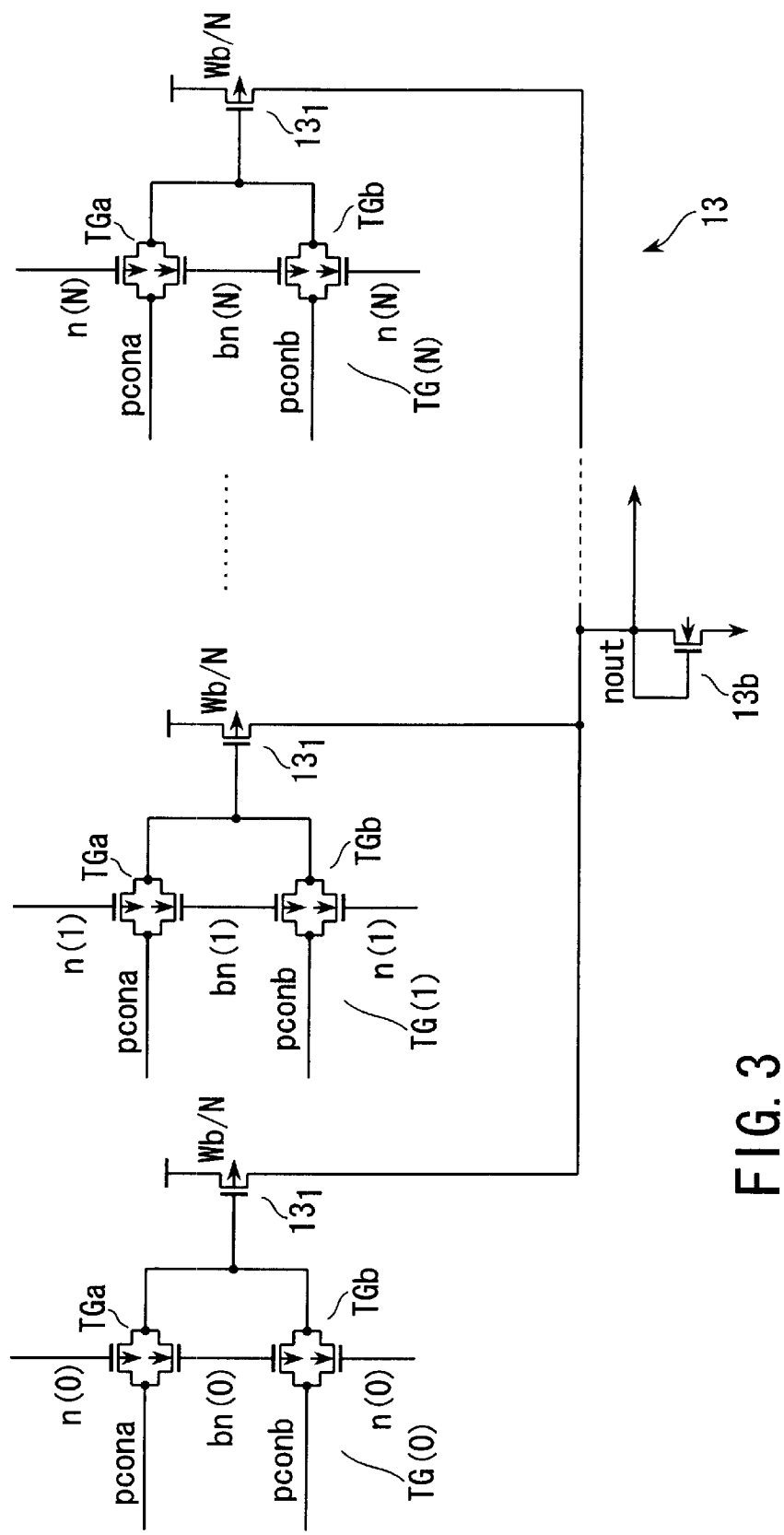
FIG. 3 is a circuit diagram showing a specific example of a current mixer in the DAC shown in FIG. 2.

FIG. 2 is a conceptual diagram. FIG. 3 shows the arrangement of the above current mixer 13 more specifically.

When the bit n(nx) of the digital signal is smaller than a bit (e.g., N/2) in which the digital signal is synchronized, the current I should be increased. In this case, the mirrored current Ia is given by:

$$Ia=(Ix)*(Wb/Wa)*(N-n)/N$$

Thus, the current Ix becomes dominant.

When the bit n(nx) of the digital signal is larger than a bit in which the digital signal is synchronized, the current I should be decreased. In this case, the mirrored current Ib is given by:

$$Ib=(Ix/b)*(Wb/Wa)*(n/N).$$

Thus, the current Ix/b becomes dominant.

The current I finally produced is therefore expressed by:

$$I=Ia+Ib=(Ix)*(Wb/Wa)((N-n)/N+n/(b*N)).$$

FIG. 3 shows an example of a circuit arrangement of the current mixer 13 more specifically. Referring to FIG. 3, gate pairs TG(0) to TG(N) are provided in correspondence with the digital signals (bit n(nx): nx=0, 1, 2, ..., N). The gate pairs TG(0) to TG(N) each include a first transfer gate TGa and a second transfer gate TGb.

The first transfer gate TGa is supplied with an output (first current) pcona of the operational amplifier 12a of the differential amplifier 12A. When the digital signal (bit n(nx): nx=0, 1, 2, ..., N) is at a low level, the first transfer gate TGa turns on. The second transfer gate TGb is supplied with an output (second current) pconb of the operational amplifier 12a' of the differential amplifier 12B. When the digital signal (bit n(nx)) is at a high level, the second transfer gate TGb turns on. In FIG. 3, bn(nx) indicates an inverted signal of the digital signal (bit n(nx)). Each of the gate pairs TG(0) to TG(N) mirrors a gate voltage of one of the outputs pcona and pconb in accordance with the level of the digital signal (bit n(nx)).

The gate pairs TG(0) to TG(N) each include a PMOS transistor 13₁ as a fourth transistor. The channel width of each PMOS transistor 13₁ is Wb/N. The channel width of all the PMOS transistors 13₁ is Wb in total.

The drains of the respective PMOS transistors 13₁ are connected in common to the NMOS transistor 13b.

Figure 4:
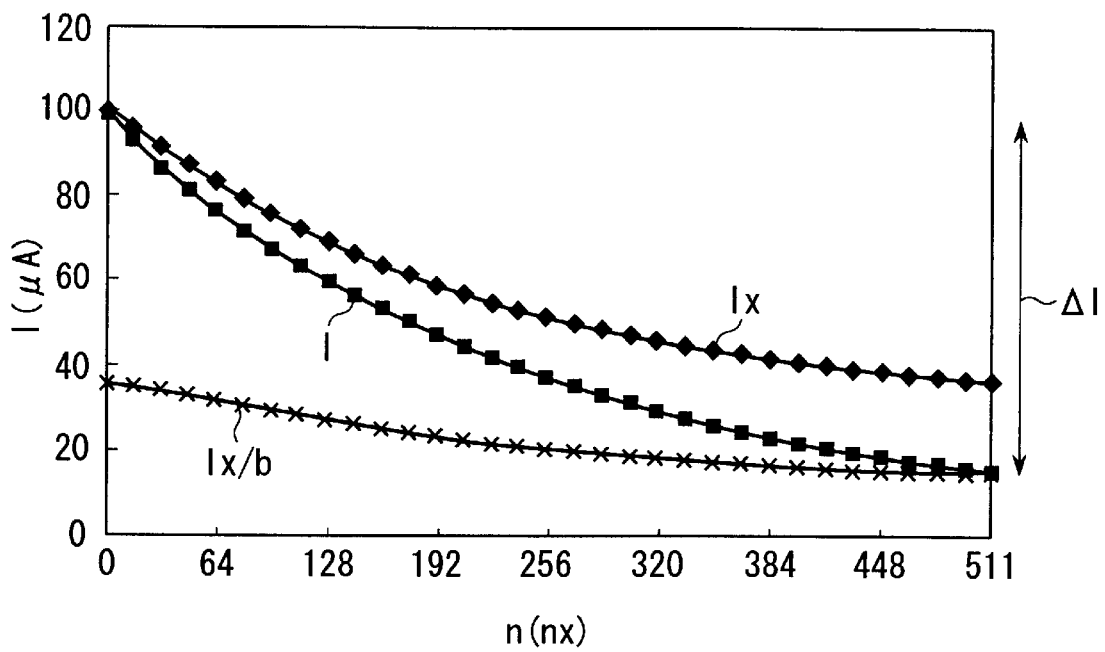
FIG. 4 is a graph explaining a relationship between a digital signal and an amount of current in the DAC described above.

FIG. 4 shows a relationship between the digital signal (bit n(nx)) and the amount of current I in the DAC 1' having the above configuration. In FIG. 4, the value of b of the resistor b*R in the differential amplifier 12B is 3, and the number of bits n(nx) of the digital signal is 512.

The gate pairs TG(0) to TG(511) are so controlled that the dominant state of the output pcona is gradually changing to that of the output pconb each time the bit of the digital signal increases by one from n(0) to n(511). When the bit of the digital signal is n(0), the bits n(0) to n(511) of the respective gate pairs TG(0) to TG(511) are all at a low level. In each of the gate pairs TG(0) to TG(511), the gate voltage of the first transfer gate TGa is mirrored. The output pcona is therefore supplied to the gates of the PMOS transistors 13₁ corresponding to the gate pairs TG(0) to TG(511).

When the bit of the digital signal is n(1), the bit n(0) of the gate pair TG(0) is at a high level. In the gate pair TG(0), the gate voltage of the second transfer gate TGb is mirrored. The output pconb is therefore supplied to the gate of the PMOS transistor 13₁ corresponding to the gate pair TG(0). Further, the bits n(1) to n(511) of the gate pairs TG(1) to TG(511) are at a low level. In each of the gate pairs TG(1) to TG(511), the gate voltage of the first transfer gate TGa is mirrored. The output pcona is therefore supplied to the gates of the PMOS transistors 13₁ corresponding to the gate pairs TG(1) to TG(511).

Similarly, when the bit of the digital signal is n(510), the bits n(0) to n(510) of the gate pairs TG(0) to TG(510) are at a high level. In each of the gate pairs TG(0) to TG(510), the gate voltage of the second transfer gate TGb is mirrored. The output pconb is therefore supplied to the gates of the PMOS transistors 13₁ corresponding to the gate pairs TG(0) to TG(510). Further, the bit n(511) of the gate pair TG(511) is at a low level. In the gate pair TG(511), the gate voltage of the first transfer gate TGa is mirrored. The output pcona is therefore supplied to the gate of the PMOS transistor 13₁ corresponding to the gate pair TG(511).

When the bit of the digital signal is n(511), the bits n(0) to n(511) of the gate pairs TG(0) to TG(511) are all at a high level. In each of the gate pairs TG(0) to TG(511), the gate voltage of the second transfer gate TGb is mirrored. The output pconb is therefore supplied to the gates of the PMOS transistors 13₁ corresponding to the gate pairs TG(0) to TG(511).

The above control makes it possible to increase the amount of variation ΔI in current I obtained by assigning weights to the currents Ix and Ix/b and adding them together, as shown in FIG. 4.

Figure 5:
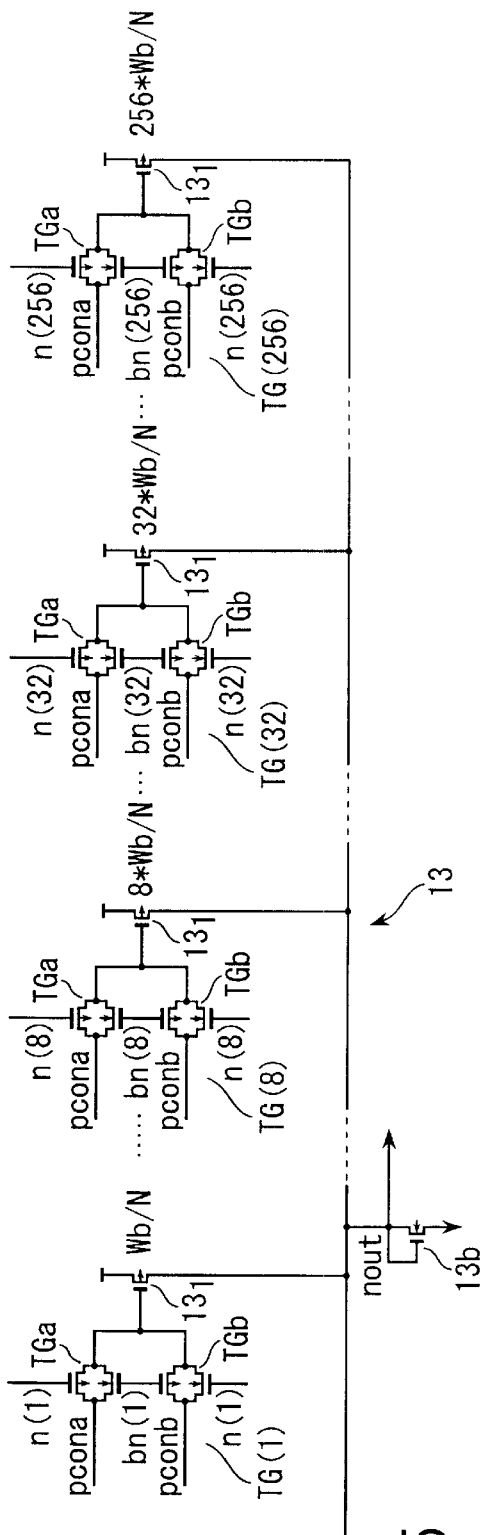
FIG. 5 is a circuit diagram showing another example of the current mixer shown in FIG. 3.

As the current mixer 13, the gate pairs TG(nx) need not be required by the number (512) corresponding to that of bits n(nx) of the digital signal. For example, when the number of bits n(nx) is 512, the gate pairs TG(nx) have only to be provided such that the sum of bits n(nx) corresponding to the gate pairs becomes 512. Specifically, as shown in FIG. 5, the gate pairs TG(nx) can be provided in correspondence with only binary bits n(1, 2, 4, 8, 16, 32, ..., 256) of the bits n(nx) (nx=0, 1, 2, ..., 511).

Figure 6:
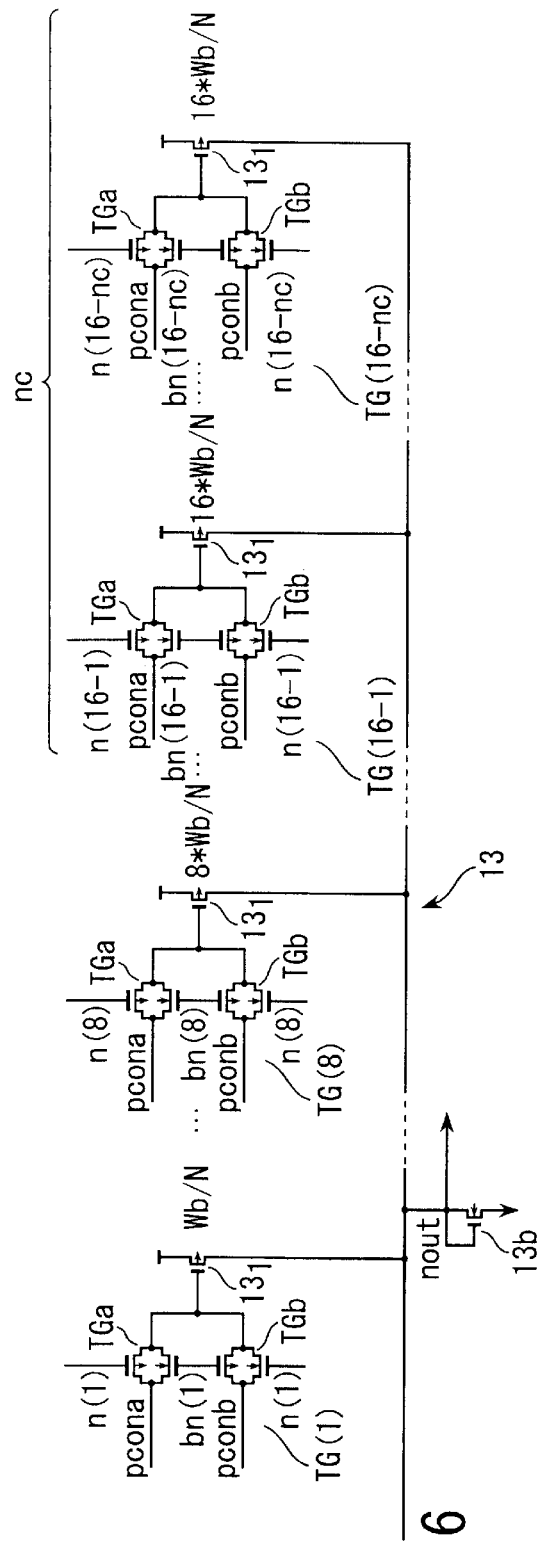
FIG. 6 is a circuit diagram showing still another example of the current mixer shown in FIG. 3.

All of bits n(nx) of the digital signal can be covered by a combination of bits n(nx) corresponding to the gate pairs TG(nx). Specifically, as shown in FIG. 6, one gate pair TG(nx) can be provided for each of bits n(1, 2, 4, 8) of the bits n(nx) (nx=0, 1, 2, ..., 511) and nc(31) gate pairs TG(nx) can be provided for the bit n(16).

Figure 7:
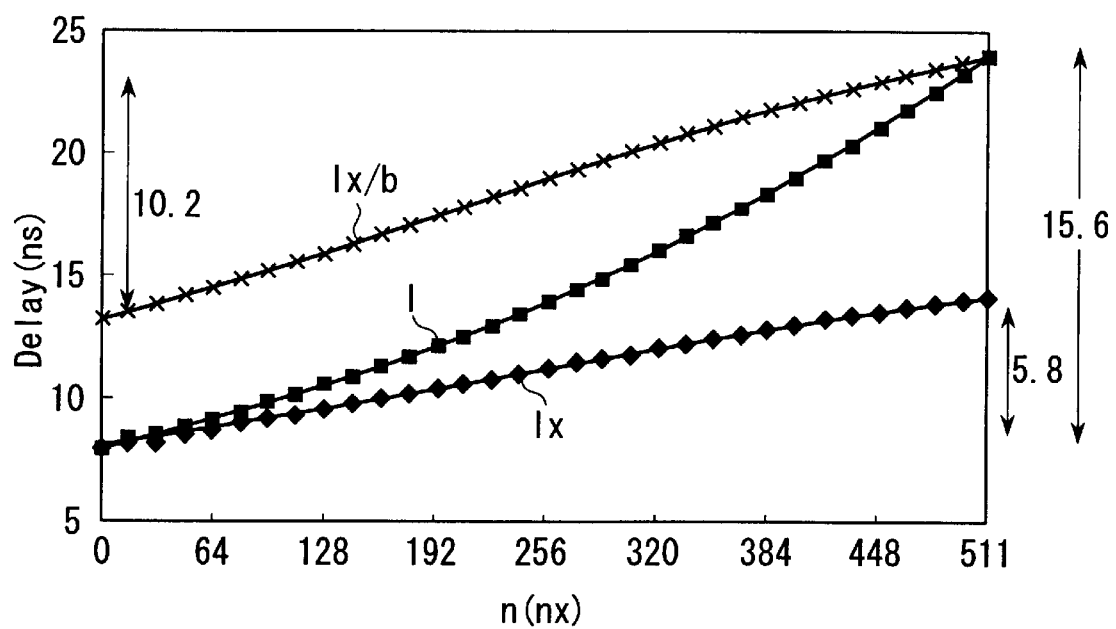
FIG. 7 is a graph explaining a relationship between a digital signal and an amount of delay when an analog DLL is configured using the DAC described above.
Figure 10:
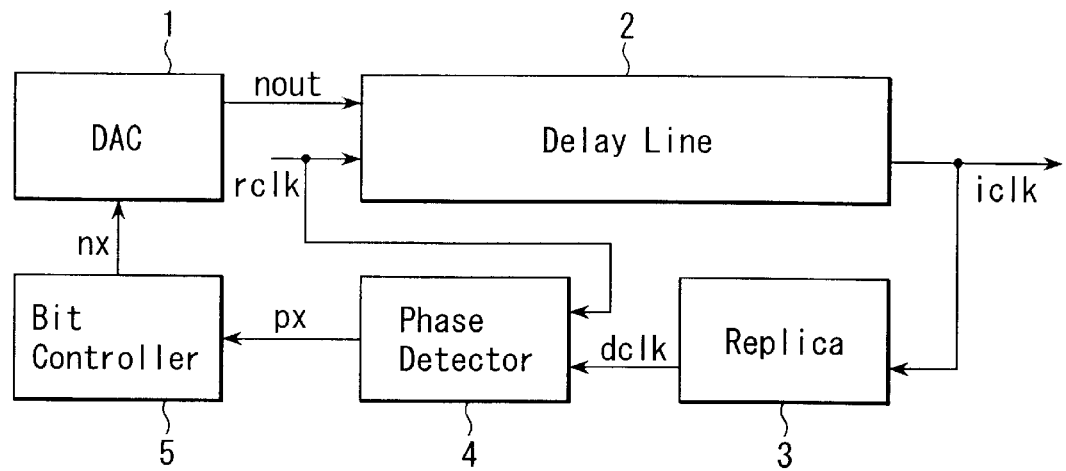
FIG. 10 is a block diagram showing an example of a configuration of an analog DLL using a current control delay unit.
Figure 11:
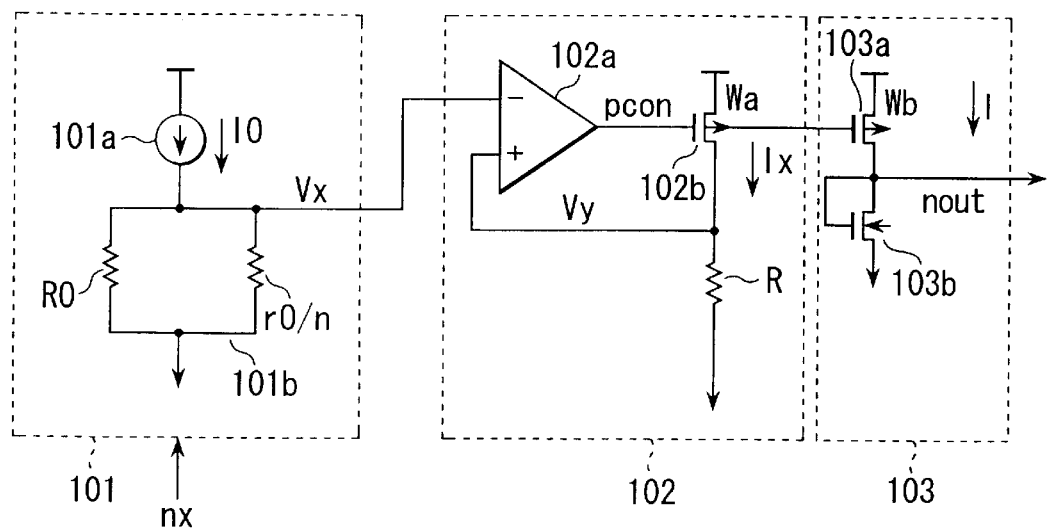
FIG. 11 is a circuit diagram showing a prior art DAC and explaining its problems.

FIG. 7 shows a relationship between the digital signal (bit n(nx)) and the amount of delay when an analog DLL (see FIG. 10) is constructed using the above-described DAC1'. In the case of FIG. 7, the value of b of the resistor b*R in the differential amplifier 12B is 3 and the number of bits n(nx) of the digital signal is 512.

As is apparent from FIG. 4, when the DAC1' is used, the amount of variation ΔI in current I can be increased irrespective of the operating range of the current mirror. Therefore, as shown in FIG. 7, the amount of delay on the delay line 2 can be varied more greatly than when only one current (e.g., Ix) is used.

Incidentally, only a delay of 5.8 ns is caused when the current Ix is used. In contrast, a delay of 15.6 ns can be caused when the current I is used and, in this case, the number of stages of delay elements is 28. In order to cause the same delay (15.6 ns) by the current Ix, 75 (=28*15.6/5.8) stages of delay elements are required.

As described above, the resistance value of the parallel variable resistor 11b is controlled by the bit n(nx) of the digital signal. Two currents Ix and Ix/b that differ in the amount of variation are generated in accordance with a change of the number n of resistors r0 connected to the resistor R0. The generated currents Ix and Ix/b are weighted and added together in accordance with the bit n(nx). Thus, the current I whose variation amount ΔI is larger than when one current is used, can be generated. Therefore, the amount of delay can be varied greatly without increasing the number of delay elements when the DAC1' of the first embodiment is applied to the analog DLL. Conversely, in order to obtain the same amount of delay, the number of delay elements can be reduced and accordingly the layout area can be decreased and so can be the power consumption.

Moreover, the synchronization of a high frequency clock signal can easily be obtained even when the amount of variation ΔI in current I is large. Consequently, both the extension of the frequency range of the clock signal to be synchronized and the obtainment of a large amount of delay are compatible with each other.

Second Embodiment

Figure 8:
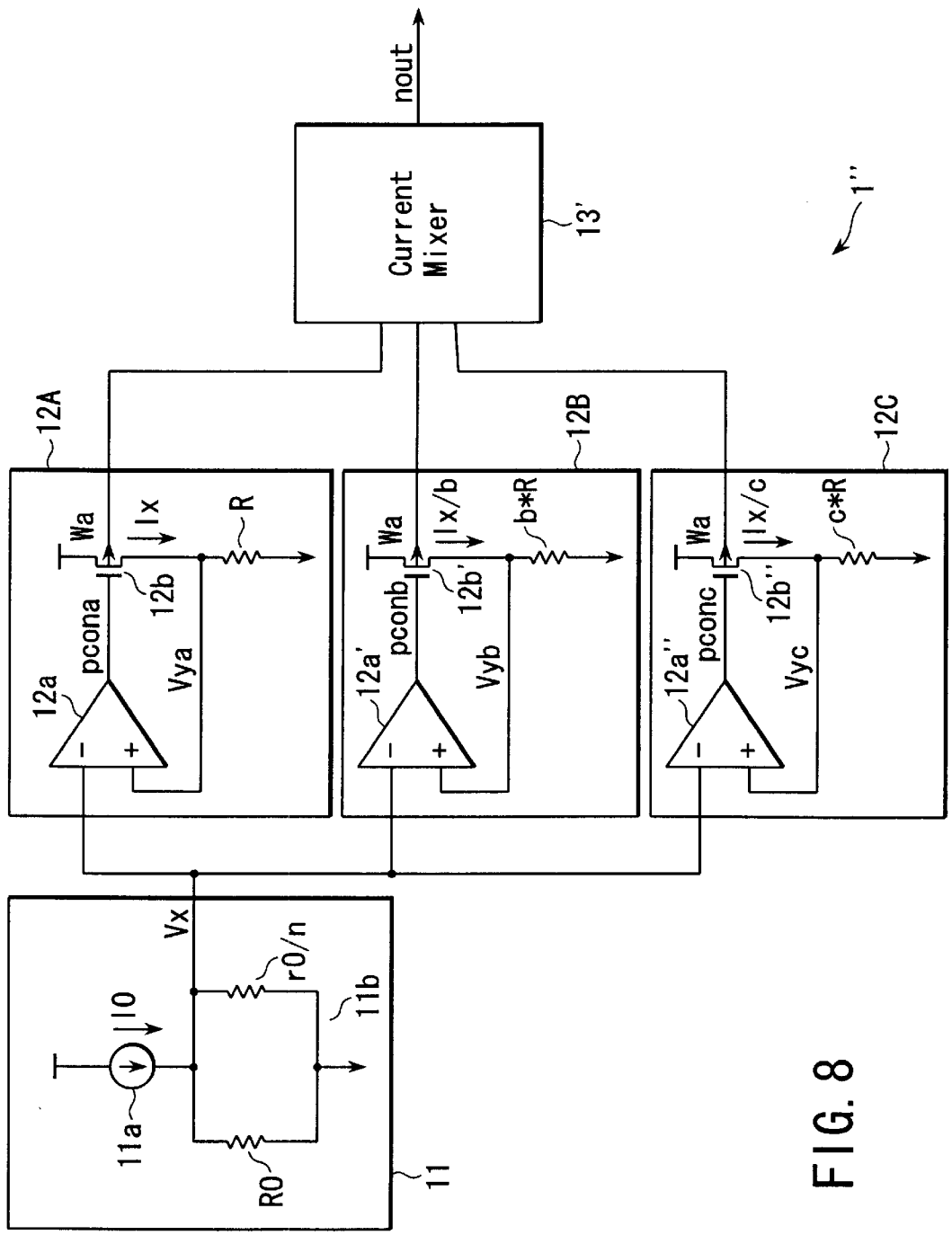
FIG. 8 is a circuit block diagram showing an example of a configuration of a DAC according to a second embodiment of the present invention, which is used in an analog DLL.

FIG. 8 shows a configuration of another DAC according to a second embodiment of the present invention, which is used in an analog DLL. In the second embodiment, three differential amplifiers are employed.

Referring to FIG. 8, the DAC 1" comprises a digital voltage converter 11, first, second and third differential amplifiers 12A, 12B and 12C, and a current mixer 13' as an adder.

The digital voltage converter 11 includes a constant-current source 11a and a parallel variable resistor 11b. The parallel variable resistor 11b has a resistor R0 as a first resistor and a plurality of resistors r0/n as second resistors arranged in parallel with the resistor R0 (In FIG. 8, a plurality of resistors r0 are shown as a composite one r0/n for the sake of convenience). The digital voltage converter 11 controls a resistance value of the parallel variable resistor 11b in response to a digital signal (bit n(nx): nx=0, 1, 2, ..., N). The number n of resistors r0 connected to the resistor R0 is changed. Thus, the digital voltage converter 11 freely varies a generated potential Vx in response to the digital signal (bit n(nx)). The potential Vx is expressed by the following equation:

$$Vx=(I0)*(R0*r0/n)/(R0+r0/n)$$

The differential amplifier 12A includes a current-mirror type operational amplifier 12a, a PMOS transistor (channel width Wa) 12b as a first transistor, and a resistor (third resistor) R. The potential Vx generated from the digital voltage converter 11 is applied to an inverting input (−) terminal of the operational amplifier 12a. The gate of the PMOS transistor 12b is connected to the output terminal of the operational amplifier 12a. The drain of the PMOS transistor 12b is connected to a noninverting input (+) terminal of the operational amplifier 12a. The resistor R is connected to the drain of the PMOS transistor 12b. In other words, the differential amplifier 12A controls current (first current) Ix flowing through the resistor R such that the potential Vx at the inverting input terminal of the operational amplifier 12a and the potential Vya at the noninverting input terminal thereof become equal to each other.

The differential amplifier 12B includes a current-mirror type operational amplifier 12a', a PMOS transistor (channel width Wa) 12b' as a first transistor, and a resistor (third resistor) b*R. The potential Vx generated from the digital voltage converter 11 is applied to an inverting input (−) terminal of the operational amplifier 12a'. The gate of the PMOS transistor 12b' is connected to the output terminal of the operational amplifier 12a'. The drain of the PMOS transistor 12b' is connected to a noninverting input (+) terminal of the operational amplifier 12a'. The resistor b*R is connected to the drain of the PMOS transistor 12b'. The resistance value of the resistor b*R is b (b>1) times as large as that of the resistor R. In other words, the differential amplifier 12B controls current (second current) Ix/b flowing through the resistor b*R such that the potential Vx at the inverting input terminal of the operational amplifier 12a' and the potential Vyb at the noninverting input terminal thereof become equal to each other.

The differential amplifier 12C includes a current-mirror type operational amplifier 12a", a PMOS transistor (channel width Wa) 12b" as a first transistor, and a resistor (third resistor) c*R. The potential Vx generated from the digital voltage converter 11 is applied to an inverting input (−) terminal of the operational amplifier 12a". The gate of the PMOS transistor 12b" is connected to the output terminal of the operational amplifier 12a". The drain of the PMOS transistor 12b" is connected to a noninverting input (+) terminal of the operational amplifier 12a". The resistor c*R is connected to the drain of the PMOS transistor 12b". The resistance value of the resistor c*R is c (c>b>1) times as large as that of the resistor R. In other words, the differential amplifier 12C controls current (third current) Ix/c flowing through the resistor c*R such that the potential Vx at the inverting input terminal of the operational amplifier 12a" and the potential Vyc at the noninverting input terminal thereof become equal to each other.

Figure 9:
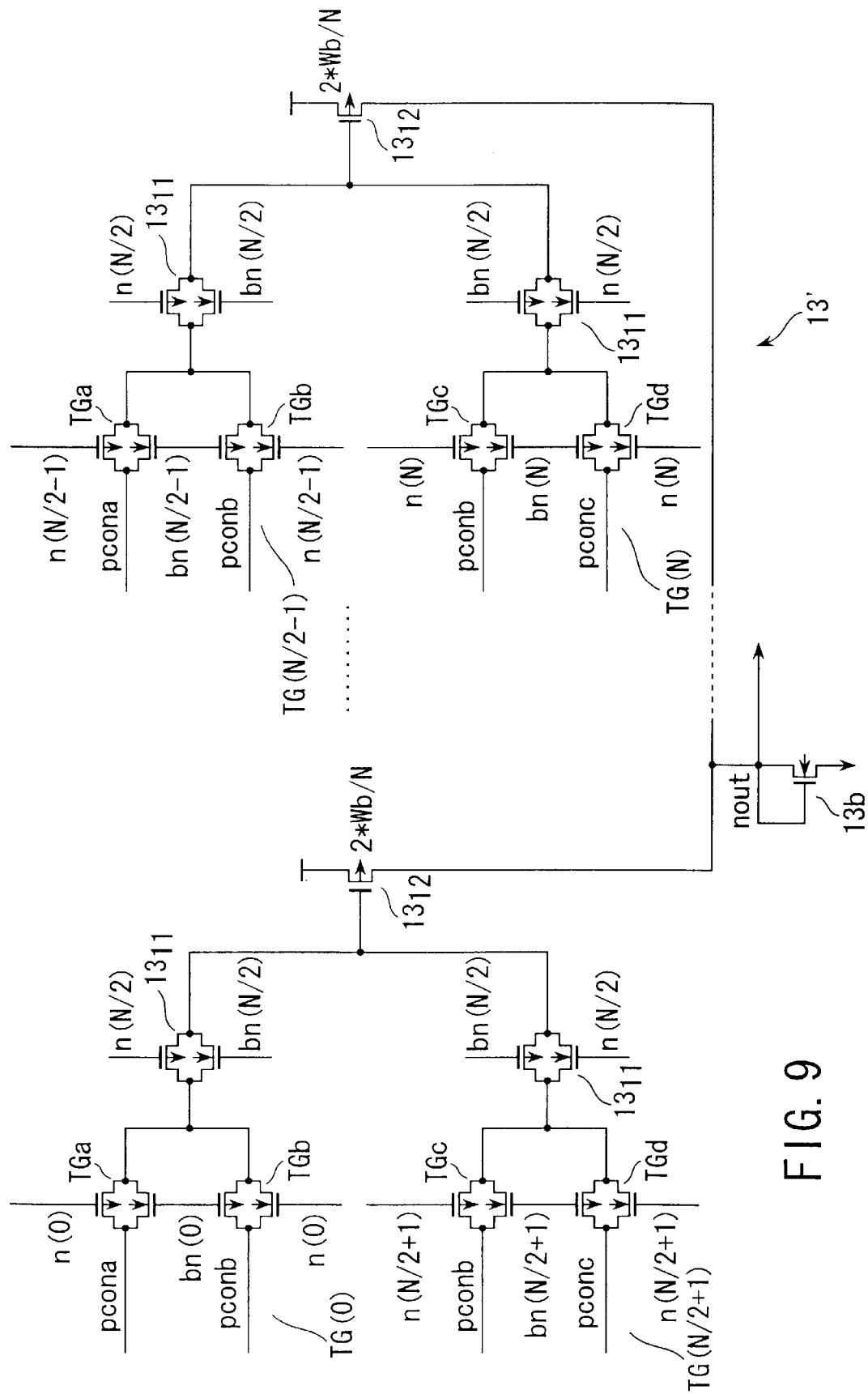
FIG. 9 is a circuit diagram showing a specific example of a current mixer in the DAC shown in FIG. 8.

The current mixer 13' assigns weights to the respective currents Ix, Ix/b and Ix/c generated from the differential amplifiers 12A, 12B and 12C and adds them together using the digital signal (bit n(nx)). Thus, the above current mixer 13' generates an analog signal nout corresponding to the amount of current I. FIG. 9 shows a more specific circuit diagram of the foregoing current mixer 13'. In FIG. 9, the current mixer 13' is separated by bit n (N/2) of the digital signal (bit n(nx): nx=0, 1, 2, 3, ..., N) for simple description.

Referring to FIG. 9, a gate pair TG(0) is provided in correspondence with bit n(0) of the digital signal, and a gate pair TG(N/2−1) is provided in correspondence with bit n(N/2−1) of the digital signal. A gate pair TG(N/2) is provided in correspondence with bit n(N/2) of the digital signal, and a gate pair TG(N) is provided in correspondence with bit n(N) of the digital signal The gate pairs TG(0) to TG(N/2−1) each include a first transfer gate TGa and a second transfer gate TGb. The first transfer gate TGa is supplied with an output pcona of an operational amplifier 12a of the differential amplifier 12A, which corresponds to the above first current Ix. When the bits n(0) to n(N/2−1) of the digital signal are at a low level, the first transfer gate TGa turns on. The second transfer gate TGb is supplied with an output pconb of an operational amplifier 12a' of the differential amplifier 12B, which corresponds to the above second current Ix/b. When the bits n(0) to n(N/2−1) of the digital signal are at a high level, the second transfer gate TGb turns on. In FIG. 9, bn(0) to bn(N/2−1) indicate inverted signals of bits n(0) to n(N/2−1) of the digital signal.

The gate pairs TG(N/2+1) to TG(N) each include a third transfer gate TGc and a fourth transfer gate TGd. The third transfer gate TGc is supplied with an output pconb of the operational amplifier 12a' of the differential amplifier 12B. When the bits n(N/2+1) to n(N) of the digital signal are at a low level, the third transfer gate TGc turns on. The fourth transfer gate TGd is supplied with an output pconc of an operational amplifier 12a" of the differential amplifier 12C. When the bits n(N/2+1) to n(N) of the digital signal are at a high level, the fourth transfer gate TGd turns on. In FIG. 9, bn(N/2+1) to bn(N) indicate inverted signals of bits n(N/2+1) to n(N) of the digital signal.

Fifth and sixth transfer gates $13_{11}$ are connected to their respective gate pairs TG(0) and TG(N/2+1). The transfer gates $13_{11}$ are connected in common to the gate of an NMOS transistor $13_{12}$ serving as a fourth transistor. Similarly, fifth and sixth transfer gates $13_{11}$ are connected to their respective gate pairs TG(N/2−1) and TG(N). The transfer gates $13_{11}$ are connected in common to the gate of the NMOS transistor $13_{12}$.

The channel width of the NMOS transistor $13_{12}$ is set at 2*Wb/N. The drain of the NMOS transistor $13_{12}$ is connected to the NMOS transistor 13b.

In the current mixer 13', either output pcona or pconb is applied as a gate voltage of the NMOS transistor $13_{12}$ between bit n(0) and bit n(N/2−1) of the digital signal. In the gate pairs TG(N/2+1) to TG(N) corresponding to bits n(N/2+1) to n(N) of the digital signal, the output pconb is applied as the gate voltage of the NMOS transistor $13_{12}$.

Either output pconb or pconc is applied as a gate voltage of the NMOS transistor $13_{12}$ between bit n(N/2+1) and bit n(N) of the digital signal. In the gate pairs TG(0) to TG(N/2−1) corresponding to bits n(0) to n(N/2−1) of the digital signal, the output pconb is applied as the gate voltage of the NMOS transistor $13_{12}$.

In the foregoing circuit arrangement, the current I obtained by assigning weights to currents Ix, Ix/b, and Ix/c and adding them together is given as follows:

$$I=(Ix*Wb)/(2*Wa)[(1/b)+\{(N/2)-n\}/(N/2)+n/(b*N/2)](n<N/2)=\\(Ix*Wb)/(2*Wa)[(1/b)+(N-n)/(b*N/2)+\{n-(N/2)\}/(c*N/2)](N/2 \leq n<N).$$

Substantially the same advantage as that of the first embodiment can be expected in the second embodiment. The amount of variation ΔI in current I can be increased. Therefore, when the DAC1" of the second embodiment is applied to the analog DLL, the amount of delay can be varied greatly without increasing the number of delay elements.

In the second embodiment, the current mixer 13' is separated by the bit n (N/2) of the digital signal. The present invention is not limited to this, but the bit n(nx) by which the current mixer is separated can freely be selected.

The second embodiment is directed to three differential amplifiers. Four or more differential amplifiers can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A digital-to-analog converter circuit comprising:
   a converter configured to convert digital signals of bit n (n=0, 1, 2, . . . , N) to voltage values;
   a plurality of amplifiers configured to output currents having different values in accordance with the voltage values; and
   an adder configured to assigning weights to the currents and adding the currents together in response to the digital signal of bit n.

2. The digital-to-analog converter circuit according to claim 1, wherein the converter includes a constant-current source and a parallel variable resistor, the parallel variable resistor contains a first resistor and a plurality of second resistors connected to the first resistor in parallel, and the number of the second transistors is changed in response to the digital signal of bit n.

3. The digital-to-analog converter circuit according to claim 1, wherein the plurality of amplifiers each include a current-mirror type operational amplifier, a first transistor, and a third resistor, an inverting input terminal of the current-mirror type operational amplifier is connected to the converter, a noninverting input terminal thereof is connected to a drain of the first transistor, and an output terminal thereof is connected to a gate of the first transistor, the third resistor is connected between the drain of the first transistor and a ground, and a resistance value of the third resistor varies from amplifier to amplifier.

4. The digital-to-analog converter circuit according to claim 3, wherein the plurality of amplifiers include at least a first amplifier and a second amplifier, the first amplifier outputs a first current, and the second amplifier outputs a second current whose amount is smaller than that of the first current.

5. The digital-to-analog converter circuit according to claim 1, wherein the adder includes a plurality of second transistors, the second transistors are each mirror-connected to the first transistor of each of the plurality of amplifiers, a ratio of a total of channel widths of the second transistors to that of the first transistor is Wa:Wb, at least one of the second transistors assigns weights to the second current by n/N, and at least another one of the second transistors assigns weights to the first current by (N−n)/N.

6. The digital-to-analog converter circuit according to claim 5, wherein the adder includes a third transistor, and a gate and a drain of the third transistor are connected to drains of the plurality of second transistors.

7. The digital-to-analog converter circuit according to claim 1, wherein the adder includes a plurality of gate pairs, the plurality of gate pairs each contain a first transfer gate and a second transfer gate, and the first transfer gate is supplied with the first current and the second transfer gate is supplied with the second current.

8. The digital-to-analog converter circuit according to claim 7, wherein the first transfer gate turns on when the digital signal of bit n is at a low level, and the second transfer gate turns on when the digital signal of bit n is at a high level.

9. The digital-to-analog converter circuit according to claim 7, wherein the plurality of gate pairs include fourth transistors, respectively, the fourth transistors each have a channel width of Wb/N, and the number of the fourth transistors corresponds to the number N of the digital signals of bit n.

10. The digital-to-analog converter circuit according to claim 7, wherein the plurality of gate pairs include nbm+1 transistors whose channel width relative ratio is W, where W is equal to 1, 2, 4, . . . , $2^{nbm}$ and nbm is an integer, and a sum of channel width relative ratios corresponds to number N of digital signals of bit n, the number N being given by:

$$N = \sum_{nb=0}^{nb=nbm} 2^{nb}.$$

11. The digital-to-analog converter circuit according to claim 7, wherein the plurality of gate pairs include nbm+1 transistors whose channel width relative ratio is W and nc transistors whose channel width relative ratio is $2^{nbm+1}$, where W is equal to 1, 2, 4, . . . , $2^{nbm}$ and nbm and nc are each an integer, number N of digital signals of bit n being given by:

$$N = \sum_{nb=0}^{nb=nbm} 2^{nb} + (2^{nbm+1}) \times nc.$$

12. The digital-to-analog converter circuit according to claim 9, wherein the fourth transistors include drains connected in common to a gate and a drain of a third transistor.

13. The digital-to-analog converter circuit according to claim 3, wherein the plurality of amplifiers include at least a first amplifier, a second amplifier, and a third amplifier, the first amplifier outputs a first current, the second amplifier outputs a second current whose current amount is smaller than that of the first current, and the third amplifier outputs a third current whose current amount is smaller than that of the second current.

14. The digital-to-analog converter circuit according to claim 1, wherein the adder includes a plurality of gate pairs, the plurality of gate pairs each contains a first gate pair and a second gate pair, the first gate pair has a first transfer gate and a second transfer gate, the second gate pair has a third transfer gate and a fourth transfer gate, the first transfer gate is supplied with a first current, the second and third transfer gates are supplied with a second current, and the fourth transfer gate is supplied with a third current.

15. The digital-to-analog converter circuit according to claim 14, wherein the first transfer gate turns on when bits n(0) to n(N/2−1) of the digital signal are at a low level, the second transfer gate turns on when bits n(0) to n(N/2−1) of the digital signal are at a high level, the third transfer gate turns on when bits n(N/2+1) to n(N) are at a low level, and the fourth transfer gate turns on when bits n(N/2+1) to n(N) are at a high level.

16. The digital-to-analog converter circuit according to claim 14, wherein a fifth transfer gate is connected to the first gate pair and a sixth transfer gate is connected to the second gate pair, the fifth transfer gate of the first gate pair turns on when bit n(N/2) of the digital signal of bit n is at a low level, and the sixth transfer gate of the second gate pair turns on when the bit n(N/2) is at a high level.

17. The digital-to-analog converter circuit according to claim 14, wherein the plurality of gate pairs include fourth transistors, respectively, the fourth transistors each have a channel width of 2*Wb/N, and the number of the fourth transistors corresponds to half the number N of digital signals of bit n.

18. The digital-to-analog converter circuit according to claim 17, wherein the fourth transistors include drains connected in common to a gate and a drain of a third transistor.

19. A synchronous circuit comprising:

a digital-to-analog converter circuit including a converter configured to convert digital signals of bit n (n=0, 1, 2, . . . , N) to voltage values, a plurality of amplifiers configured to output currents having different values in accordance with the voltage values obtained by the converter, and an adder configured to assign weights to the currents and add the currents together in response to the digital signals of bit n;

a delay line including a unit delay element that receives an output from the digital-to-analog converter circuit and varies in delay amount according to the output;

a phase detector configured to compare an output of the delay line and a phase of a reference signal with each other; and a generator configured to generate the digital signal of bit n in response to an output of the phase detector.

20. A synchronous circuit comprising:

a digital-to-analog converter circuit including a converter configured to convert digital signals of bit n (n=0, 1, 2, . . . , N) to voltage values, a plurality of amplifiers configured to output currents having different values in accordance with the voltage values obtained by the converter, and an adder configured to assign weights to the currents and add the currents together in response to the digital signals of bit n, the adder having a common node supplied with the added currents and connected to a gate and a drain of a transistor;

a delay line including a unit delay element that receives an output from the digital-to-analog converter circuit and varies in delay amount according to the output;

a phase detector configured to compare an output of the delay line and a phase of a reference signal with each other; and a generator configured to generate the digital signal of bit n in response to an output of the phase detector.

* * * * *